United States Patent
Hansel et al.

(10) Patent No.: US 10,636,229 B2
(45) Date of Patent: Apr. 28, 2020

(54) BLACK BOX WITH VOLATILE MEMORY CACHING

(71) Applicant: Lyft, Inc., San Francisco, CA (US)

(72) Inventors: George James Hansel, Redwood City, CA (US); Yi Lu, San Jose, CA (US)

(73) Assignee: Lyft, Inc., San Francisco, CA (US)

( * ) Notice: Subject to any disclaimer, the term of this patent is extended or adjusted under 35 U.S.C. 154(b) by 0 days.

(21) Appl. No.: 15/955,604

(22) Filed: Apr. 17, 2018

(65) Prior Publication Data

US 2019/0318555 A1    Oct. 17, 2019

(51) Int. Cl.
| | |
|---|---|
| *G07C 5/08* | (2006.01) |
| *G11C 7/04* | (2006.01) |
| *G11C 11/4072* | (2006.01) |
| *G11C 11/56* | (2006.01) |
| *G11C 16/10* | (2006.01) |
| *G11C 11/00* | (2006.01) |
| *G11C 5/04* | (2006.01) |
| *G07C 5/00* | (2006.01) |

(52) U.S. Cl.
CPC .............. *G07C 5/0858* (2013.01); *G11C 5/04* (2013.01); *G11C 7/04* (2013.01); *G11C 11/005* (2013.01); *G11C 11/4072* (2013.01); *G11C 11/5621* (2013.01); *G11C 16/10* (2013.01); *G07C 5/008* (2013.01); *G11C 2207/2245* (2013.01)

(58) Field of Classification Search
CPC ........ G07C 5/08; G07C 5/0841; G07C 5/085; G07C 5/0858; G07C 5/0866; G07C 5/0875; G07C 5/0883; G07C 5/0891; G11C 7/04; G11C 11/4072; G06F 1/20; G06F 1/203; G06F 1/206; B64D 2045/0065; B60H 1/005; B60H 1/32; B60H 2001/3269
See application file for complete search history.

(56) References Cited

U.S. PATENT DOCUMENTS

| | | | | |
|---|---|---|---|---|
| 5,960,888 A | * | 10/1999 | Moore, Sr. | ................ A62C 3/07 169/56 |
| 8,608,696 B1 | * | 12/2013 | DiMeo | .................. A61F 7/0085 604/113 |

(Continued)

FOREIGN PATENT DOCUMENTS

EP          1953619 A1 *    8/2008   ............... G06F 1/30

*Primary Examiner* — Peter D Nolan
*Assistant Examiner* — Sara J Lewandroski
(74) *Attorney, Agent, or Firm* — Baker Botts L.L.P.

(57) ABSTRACT

In one embodiment, an apparatus includes a volatile memory module configured to store vehicle data; a non-volatile memory module coupled to the volatile memory module; and an energy-storage module configured to provide power to the volatile memory module and the non-volatile memory module during a data transfer between the volatile memory module and the non-volatile memory module. The energy is provided to the non-volatile memory module for writing the vehicle data to non-volatile memory. The apparatus further includes a collision-detector module configured to identify a collision event of the vehicle; and a controller coupled to the energy-storage module and the collision-detector module. The controller is configured to initiate a transfer of the vehicle data stored in the volatile memory module to the non-volatile memory module in response to receiving an indication from the collision-detector module that a collision has occurred.

20 Claims, 5 Drawing Sheets

(56) References Cited

U.S. PATENT DOCUMENTS

| | | | |
|---|---|---|---|
| 9,606,591 B2* | 3/2017 | Kwon | G06F 1/206 |
| 2002/0183905 A1* | 12/2002 | Maeda | B62D 41/00 |
| | | | 701/33.4 |
| 2003/0088799 A1* | 5/2003 | Bodas | G06F 1/206 |
| | | | 713/320 |
| 2003/0112133 A1* | 6/2003 | Webb | G07C 5/008 |
| | | | 340/436 |
| 2010/0218511 A1* | 9/2010 | Rockenfeller | C09K 5/04 |
| | | | 62/3.1 |
| 2011/0111269 A1* | 5/2011 | Tse | B60L 3/0007 |
| | | | 429/50 |
| 2013/0080680 A1* | 3/2013 | Chu | G11C 7/04 |
| | | | 711/102 |
| 2016/0078693 A1* | 3/2016 | Miller | H04B 5/0031 |
| | | | 455/41.1 |
| 2017/0038805 A1* | 2/2017 | Chun | G06F 1/206 |
| 2017/0187411 A1* | 6/2017 | Coulter | H04B 1/3888 |
| 2018/0010666 A1* | 1/2018 | Marking | F16F 9/18 |
| 2018/0283741 A1* | 10/2018 | Bei | G06F 1/182 |
| 2019/0041925 A1* | 2/2019 | Ahuja | G06F 1/324 |
| 2019/0094927 A1* | 3/2019 | Kuwano | G05B 15/02 |
| 2019/0100071 A1* | 4/2019 | Tsiaras | B60G 21/0553 |
| 2019/0119029 A1* | 4/2019 | Miller | B65D 81/38 |
| 2019/0121407 A1* | 4/2019 | Lee | G06F 1/183 |

* cited by examiner

BLACK BOX WITH VOLATILE MEMORY CACHING

BACKGROUND

Vehicles may be equipped with a variety of systems or modules for enabling it to determine its surroundings to target destinations. For example, a vehicle may have an integrated computing system (e.g., one or more central processing units, graphical processing units, memory, and storage) for controlling various operations of the vehicle, such as for example assisted driving. To that end, the computing system may process data from one or more sensor arrays. For example, an vehicle may have optical cameras for, e.g., recognizing roads and lane markings; infrared cameras for, e.g., night vision; LiDARs for, e.g., detecting 360° surroundings; RADAR for, e.g., detecting distant hazards; stereo vision for, e.g., spotting hazards such as pedestrians or tree branches; wheel sensors for, e.g., measuring velocity; ultra sound for, e.g., parking and obstacle detection; global positioning system (GPS) for, e.g., determining the vehicle's current geolocation; and/or inertial measurement units, accelerometers, gyroscopes, and/or odometer systems for movement or motion detection. Data from these systems and modules may be used to safely guide the vehicle.

It may be beneficial to store sensor (e.g., video, LiDAR, or radar) and vehicle (e.g., speed or acceleration) data for playback and review purposes, as well as for 3D modeling purposes. A black box recorder in continuous operation recording this data would be subject to over 1 million write cycles per year, which exceeds the write cycle lifetime of solid-state flash memories (e.g., solid-state drives (SSDs)) by a factor of >1000. This may lead to excessive expenses to frequently replace the black box recorder in a vehicle.

DESCRIPTION OF EXAMPLE EMBODIMENTS

Figure 1:
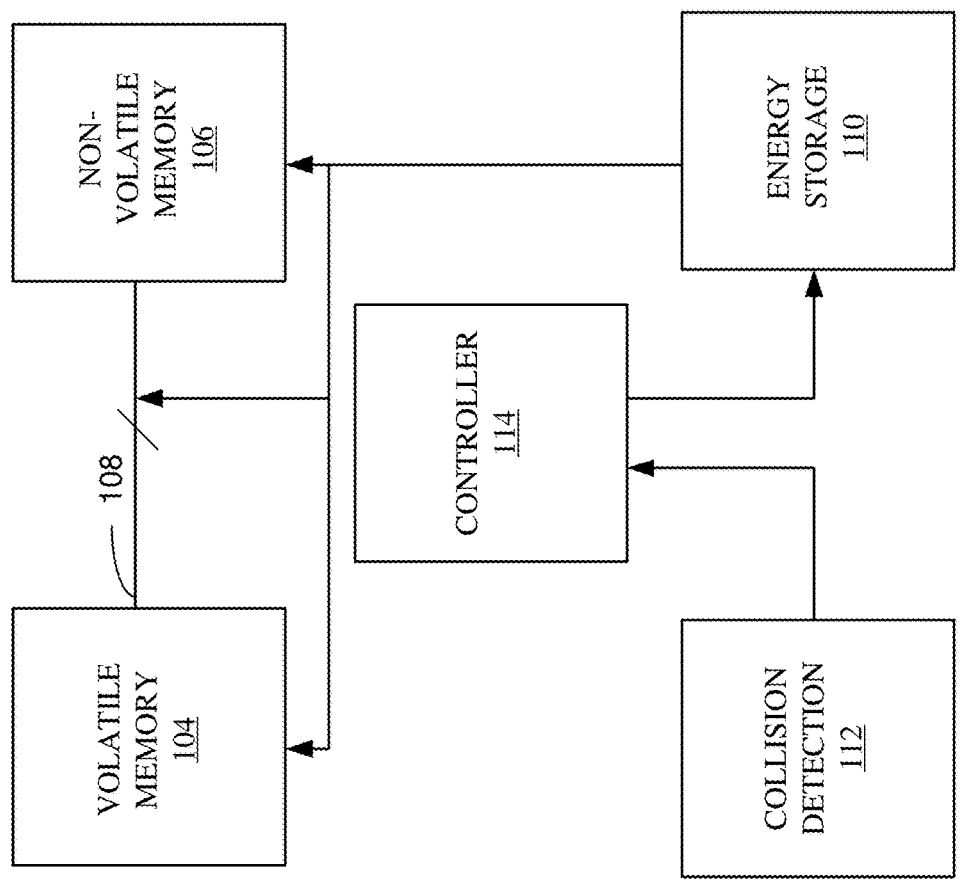
FIG. 1 illustrates a schematic of an example black box system with DDR caching.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described. In addition, the embodiments disclosed herein are only examples, and the scope of this disclosure is not limited to them. Particular embodiments may include all, some, or none of the components, elements, features, functions, operations, or steps of the embodiments disclosed above. Embodiments according to the invention are in particular disclosed in the attached claims directed to a method, a storage medium, a system and a computer program product, wherein any feature mentioned in one claim category, e.g., method, can be claimed in another claim category, e.g., system, as well. The dependencies or references back in the attached claims are chosen for formal reasons only. However, any subject matter resulting from a deliberate reference back to any previous claims (in particular multiple dependencies) can be claimed as well, so that any combination of claims and the features thereof are disclosed and can be claimed regardless of the dependencies chosen in the attached claims. The subject-matter which can be claimed comprises not only the combinations of features as set out in the attached claims but also any other combination of features in the claims, wherein each feature mentioned in the claims can be combined with any other feature or combination of other features in the claims. Furthermore, any of the embodiments and features described or depicted herein can be claimed in a separate claim and/or in any combination with any embodiment or feature described or depicted herein or with any of the features of the attached claims.

A vehicle may include one or more sensors of various and complementary types to capture information of the external environment of the vehicle. Example types of sensor data may include video or images from infrared cameras for, e.g., night vision; light detection and ranging (LiDAR) imaging data for, e.g., detecting 360° surroundings; RADAR for, e.g., detecting distant hazards and night vision; optical imaging for, e.g., detecting obstacles; global positioning system (GPS) for, e.g., determining the vehicle's current geolocation; and/or inertial measurement units and/or accelerometer for movement detection. The various types of imaging data generate especially large data files. In addition to sensor data, the navigation system generates decision data (e.g., computational logs, intermediate computation results, object detection result, etc.) as well as data regarding vehicle status (e.g., speed, sensor condition, etc.) at any given time.

A black box recorder that continuously recorded this amount of data to non-volatile memory (e.g., SSD), and that does not need to be refreshed to maintain data integrity, would be subject to over 1 million write cycles per year. This amount of write cycles will quickly degrade the lifetime of the black box recorder, leading to the vehicles being taken offline more often in order to at least replace the storage medium of the black box recorder. The more frequent downtime due to black box replacement may in turn lead to needing an increased number of vehicles in a vehicle fleet. In addition, non-volatile memory has relatively slow write times and with the vast amount of data that needs to be stored, the physical write speed of the non-volatile memory may not be able to keep pace with the rate at which data is being captured/generated.

This data may also be used to improve the algorithms that generate the 3D modeling of the vehicle external environment and improve the training of the machine learning algorithm used for vehicle navigation (e.g., assisted or autonomous). As described in more detail above, storing the required amount of raw sensor data requires a large amount of non-volatile memory (in the order of hundreds of terabytes), which would significantly increase the cost of the black box system. Particular embodiments described herein allows all the raw sensor data to be stored when a typical black box recording system may be able to only store a relatively small portion of the raw sensor data. A typical black box recording system may attempt to use a smaller amount of memory by storing compressed sensor data, storing a smaller window of data (e.g., last 5 seconds of data instead of 30 seconds), or selectively storing/discarding data (e.g., 1 out of every 10 frames in a video/LiDAR, not storing gyroscope data, etc.). A significant drawback is that these work-arounds would provide an inadequate reconstruction of events and the analysis may be more limited since the stored data is an incomplete representation of the 3D model used to by the navigation algorithm to make driving decisions. In addition, autonomous vehicles (AVs) are required to carry a black box recorder to meet regulatory requirements for review after an incident (e.g., collision) and AV power is cut-off.

Particular embodiments described herein relate to a black box recorder that includes the use of volatile memory (e.g., double-data rate dynamic random access memory (DDR DRAM) or static random access memory (SRAM)) in conjunction with the use of non-volatile memory for storing the vehicle data. As an example and not by way of limitation, the vehicle data may include raw sensor data that may be used for 3D modeling for vehicle navigation. As another example, the vehicle data may include data used for vehicle navigation (e.g., assisted or autonomous). A pre-determined amount of data by the black box recorder may be stored in volatile memory and this data subsequently transferred to non-volatile memory. This would limit the number of write cycles experienced by the non-volatile memory, thereby increasing the effective lifetime of the black box recorder, reducing the equipment replacement costs, and reducing vehicle downtime. In addition, the use of volatile memory caching provides improved write throughput to allow uninterrupted storage of the large flow of sensor data. Further, the embodiments described herein enable raw, complete sensor data to be economically stored.

FIG. 1 illustrates a schematic of an example black box system. As illustrated in the example of FIG. 1, black box recorder 102 of the vehicle includes a volatile memory module 104 (e.g., DDR DRAM) coupled to a non-volatile memory module 106 (e.g., SSD) through a bus 108. Bus 108 may include a controller for handling the transmission of data from volatile memory module 104 to non-volatile memory module 106 through bus 108. In particular embodiments, volatile memory module 104 of black box recorder 102 may be coupled to one or more sensors through a communication interface to a vehicle network system. Non-volatile memory module 106 may further include a memory controller that is configured to initiate the transfer of data from volatile memory module 104 to non-volatile memory module 106. Black box recorder 102 further includes an energy-storage module 110 and a collision-detection module 112 coupled to a controller 114. In particular embodiments, the components of the black box recorder, described in more detail above, may be contained within a black box enclosure. The black box enclosure may be constructed to withstand an impact of a collision, such that non-volatile memory module remains intact. Although this disclosure describes and illustrates a particular black box recorder with volatile memory caching having a particular configuration of particular components, this disclosure contemplates any suitable black box recorder with volatile memory caching having any suitable configuration of any suitable components.

Energy-storage module 110 may include an electronic storage device (e.g., a capacitor, supercapacitor, or memory device), mechanical-energy storage (e.g., flywheel or trapped spring), or chemical-energy storage (e.g., a battery or supersaturated salt solution). After a collision, the electrical system of the vehicle may be inoperable. For this reason, black box recorder 102 has energy-storage module 110 that allows sensor data and vehicle information to be transferred and stored even when the electrical system of the vehicle is inoperable. In particular embodiments, controller 114 may be configured to initiate the transfer of energy stored by energy-storage module 110 for writing data to non-volatile memory module 106. The write cycle of non-volatile memory module 106 may be initiated in response to receiving energy being provided by energy-storage module 110. In particular embodiments, energy-storage module 110 may be continually charged during normal operation of the vehicle. In other embodiments, energy-storage module 110 may be activated only when a collision is detected by collision-detection module 112.

Volatile memory module 104 may effectively have an unlimited number of refresh cycles, while non-volatile memory 106 has a relatively low number of write cycles primarily due to its charge storage mechanism for storing data. In particular embodiments, sensor data from the vehicle sensor array is processed by processing units of the vehicle (e.g., central processing unit (CPU) or graphics processing unit (GPU)) and transmitted to black box recorder 102 through the communication interface. Black box recorder 102 continually writes the sensor data to volatile memory 104. When a vehicle collision is detected by collision-detection module 112, controller 114 initiates the release of energy stored in energy-storage module 110 to transfer the data stored on volatile memory module 104 to non-volatile memory module 106. As an example and not by way of limitation, a collision may be detected by collision-detection module 112 through an accelerometer measuring a transition from forward movement to an instantaneous deceleration. As another example, the body of the vehicle may have a number of pressure sensors and collision-detection module 112 may detect an impact on the body of the vehicle. As yet another example, the body of the vehicle may have one or more vibration sensors that enable collision-detection module 112 to determine a collision has occurred based on detecting a large spike in vibration of the AV.

Controller 114 may initiate the transfer of data from volatile memory module 104 to non-volatile memory module 106 through bus 108 in accordance to signals transmitted by controller 114 to the bus controller of bus 108. As an example and not by way of limitation, the vehicle may constantly write updated sensor data to volatile memory module 104, such that a pre-determined amount of data is stored in volatile memory module 104 at any given time. In particular embodiments, the sensor data stored in volatile memory module 104 may include image/video, radar, or LiDAR data, as well as status information of the vehicle. In the case when collision-detection module 112 detects a collision (e.g., through a spontaneous spike in deceleration over a pre-determined threshold), a signal indicative of a collision is transmitted by collision-detection module 112 to controller 114. Controller 114 may transmit a signal to energy-storage module 110 and the controller of non-volatile memory module 106 to initiate the transfer of the data stored on volatile memory module 104 to non-volatile memory module 106.

Figure 2:
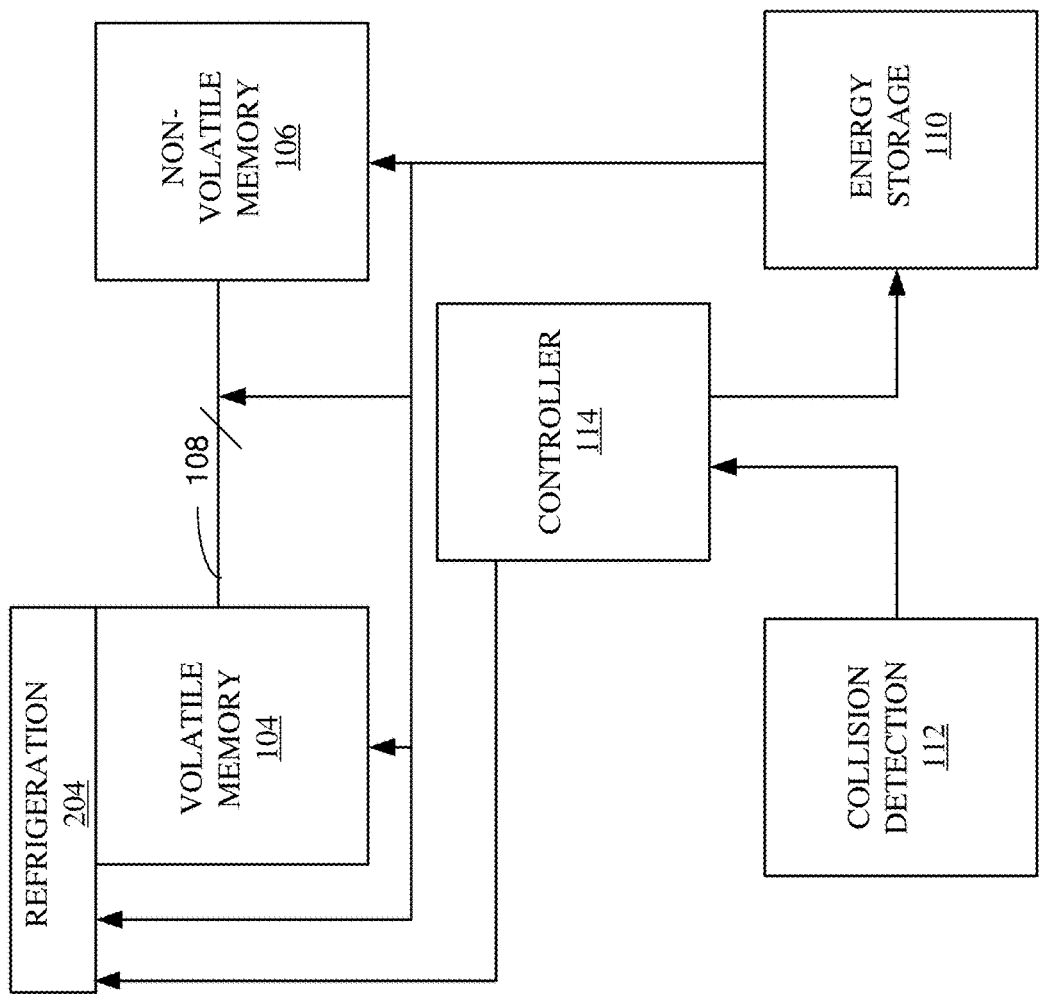
FIG. 2 illustrates a schematic of an example black box system with refrigeration.

FIG. 2 illustrates a schematic of an example black box system with refrigeration. As illustrated in the example of FIG. 2, black box recorder 202 of the vehicle includes a volatile memory module 104 coupled to a controller 114. Volatile memory 104 of black box recorder 202 may be coupled to one or more sensors through a communication interface to a vehicle network system. In particular embodiments, sensor data from the vehicle sensor array is processed by processing units of the vehicle (e.g., central processing unit (CPU) or graphics processing unit (GPU)) and transmitted to black box recorder 202 through the communication interface. Black box recorder 202 may further include a refrigeration module 204 electrically coupled to controller 114 and thermally coupled to volatile memory of volatile memory module 104. Controller 114 may transmit a signal to refrigeration module 204 in response to collision-detection module 112 determining a collision has occurred. As an example and not by way of limitation, refrigeration module 204 may be thermally coupled to a heat sink, heat pipe, or heat spreader in thermal contact with the volatile memory of volatile memory module 104. In particular embodiments, the components of the black box recorder, described in more detail above, may be contained within a black box enclosure. Although this disclosure describes and illustrates a particular black box recorder with refrigeration having a particular configuration of particular components, this disclosure contemplates any suitable black box recorder with refrigeration having any suitable configuration of any suitable components. As an example and not by way of limitation, refrigeration module 204 may include a thermo-electric device that is configured to lower the temperature of the volatile memory of volatile memory module 104 in response to receiving a signal from controller 114 after a collision has occurred.

In particular embodiments, refrigeration module 204 may include a chamber containing ammonium salt, another chamber containing water with the chambers separated by a membrane or wall. In other embodiments, the chambers may contain water and ammonium chloride, ammonium nitrate, or potassium chloride. In other embodiments, the refrigeration may be performed using a mixture of barium hydroxide octahydrate crystals with dry ammonium chloride, thionyl chloride ($SOCl_2$) with cobalt(II) sulfate heptahydrate, or ethanoic acid with sodium carbonate. In particular embodiments, the membrane or wall separating the water and ammonium salt may be ruptured by the force of a collision, which causes the ammonium salts and water to mix. The mixing of materials produces a liquid that causes a rapid cooling of the temperature. Since the mixture of the contents of the chambers is in thermal contact with the volatile memory, the volatile memory is cooled to a low temperature. In particular embodiments, the membrane or wall separating the water and ammonium salt may be mechanically moved in response to receiving a signal from controller 114 after a collision has occurred.

In particular embodiments, refrigeration module 204 may incorporate evaporative refrigerants, where detection of a collision may trigger a mechanism that ruptures a pressure vessel holding a refrigerant. As an example and not by way of limitation, the refrigerant may be stored in the pressure vessel under pressure, such that the refrigerant remains liquid at normal operating temperatures of the vehicle. When the pressure goes to ambient pressure, the refrigerant vaporizes and cools the memory module to the boiling point of the refrigerant at atmospheric pressure. As an example and not by way of limitation, the refrigerant may be a halofluorocarbon (HFC), carbon dioxide ($CO2$), or could be any suitable substance that may be held under pressure as a liquid or solid but which vaporizes at standard atmospheric pressure and temperature. If the refrigerant is nonflammable (e.g., HFC), the refrigerant may act as a fire extinguishing agent in the vicinity of black box recorder 202. Although this disclosure describes cooling volatile memory using a particular mixture of a particular materials, this disclosure contemplates cooling the volatile memory using any suitable mixture (e.g., a solid) using any suitable materials.

The data stored in volatile memory requires periodic refreshing (e.g., approximately every 64 milliseconds) to maintain the stored data. In the case when power is not provided to volatile memory module 104, the data stored in volatile memory module 104 will be lost over time unless it is refreshed. The amount of time between periodic refresh cycles (i.e., the amount of time before data lost) may be extended when the temperature of volatile memory is lowered. Black box recorder 202 continually writes the sensor data to volatile memory 104. If the temperature of volatile memory is sufficiently reduced, the volatile memory effectively becomes non-volatile memory, at least temporarily, that can store its data over a prolonged period of time without being refreshed. In particular embodiments, when a collision is detected by collision-detection module 112, controller 114 may initiate the transfer of energy stored in energy-storage module 110 to refrigeration module 106. As described above in more detail, the cooling of the volatile memory may be initiated by the force of a collision without the use of collision-detection module 112 through the mixing of water and ammonium salt. In other embodiments, this cooling of the volatile memory could be used to increase the amount of time between refresh cycles in instances where power needs to be conserved in an exigent situation.

In particular embodiments, black box recorder 202 may not include non-volatile memory module 106. When the temperature of volatile memory of volatile memory module 104 is sufficiently lowered, the volatile memory effectively becomes a non-volatile memory storing the data for a prolonged period of time without needing to be refreshed. This behavior may provide sufficient time for a field technician to retrieve the sensor data stored in volatile memory module 104 without ever transferring data to non-volatile memory. In particular embodiments, in the case of chemical-based refrigeration (e.g., mixing of water and ammonium salt), described in more detail above, black box recorder 202 may not require energy-storage module 110 since the sensor data would solely be stored in volatile memory module 104, obviating the need to provide power to write data to non-volatile memory.

Figure 3:
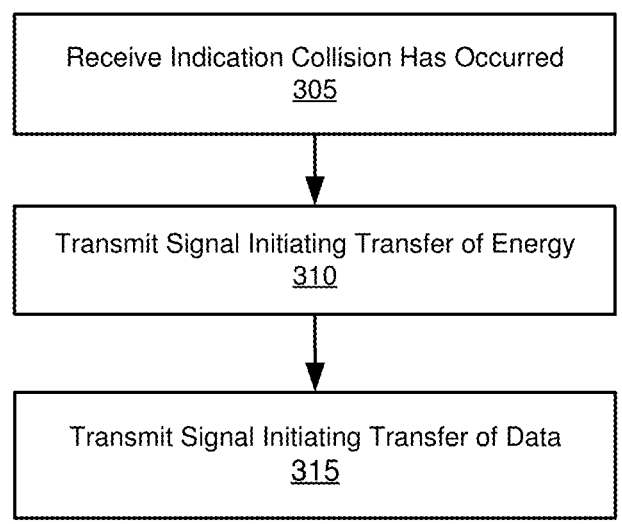
FIG. 3 illustrates an example method for storing vehicle data cached in volatile memory to non-volatile memory.

FIG. 3 illustrates an example method for storing vehicle data cached in volatile memory. The method may begin at step 305, a computing system of a controller may receive an indication from a collision-detector module that a collision has occurred. In particular embodiments, the collision-detector module may transmit a signal indicating a collision based on detecting an amount of deceleration of the vehicle is higher than a pre-determined threshold value over a relatively short period of time. In other embodiments, the collision-detector module may transmit a signal indicating a collision based on detecting an impact on the body of the vehicle. At step 310, the computing system of the controller may transmit a signal initiating a transfer to energy stored in an energy-storage module to a controller of a non-volatile memory module. At step 315, the computing device of the controller may transmit a signal initiating a transfer of vehicle data stored in a volatile memory module to the non-volatile memory module. In particular embodiment, the signal may be transmitted to a bus controller to initiate process writing the vehicle data stored in a volatile memory module to the non-volatile memory of the non-volatile memory module.

Particular embodiments may repeat one or more steps of the method of FIG. 3, where appropriate. Although this disclosure describes and illustrates particular steps of the method of FIG. 3 as occurring in a particular order, this disclosure contemplates any suitable steps of the method of FIG. 3 occurring in any suitable order. Moreover, although this disclosure describes and illustrates an example method for storing vehicle data cached in volatile memory including the particular steps of the method of FIG. 3, this disclosure contemplates any suitable method for storing vehicle data cached in volatile memory including any suitable steps, which may include all, some, or none of the steps of the method of FIG. 3, where appropriate. Furthermore, although this disclosure describes and illustrates particular components, devices, or systems carrying out particular steps of the method of FIG. 3, this disclosure contemplates any suitable combination of any suitable components, devices, or systems carrying out any suitable steps of the method of FIG. 3.

Figure 4:
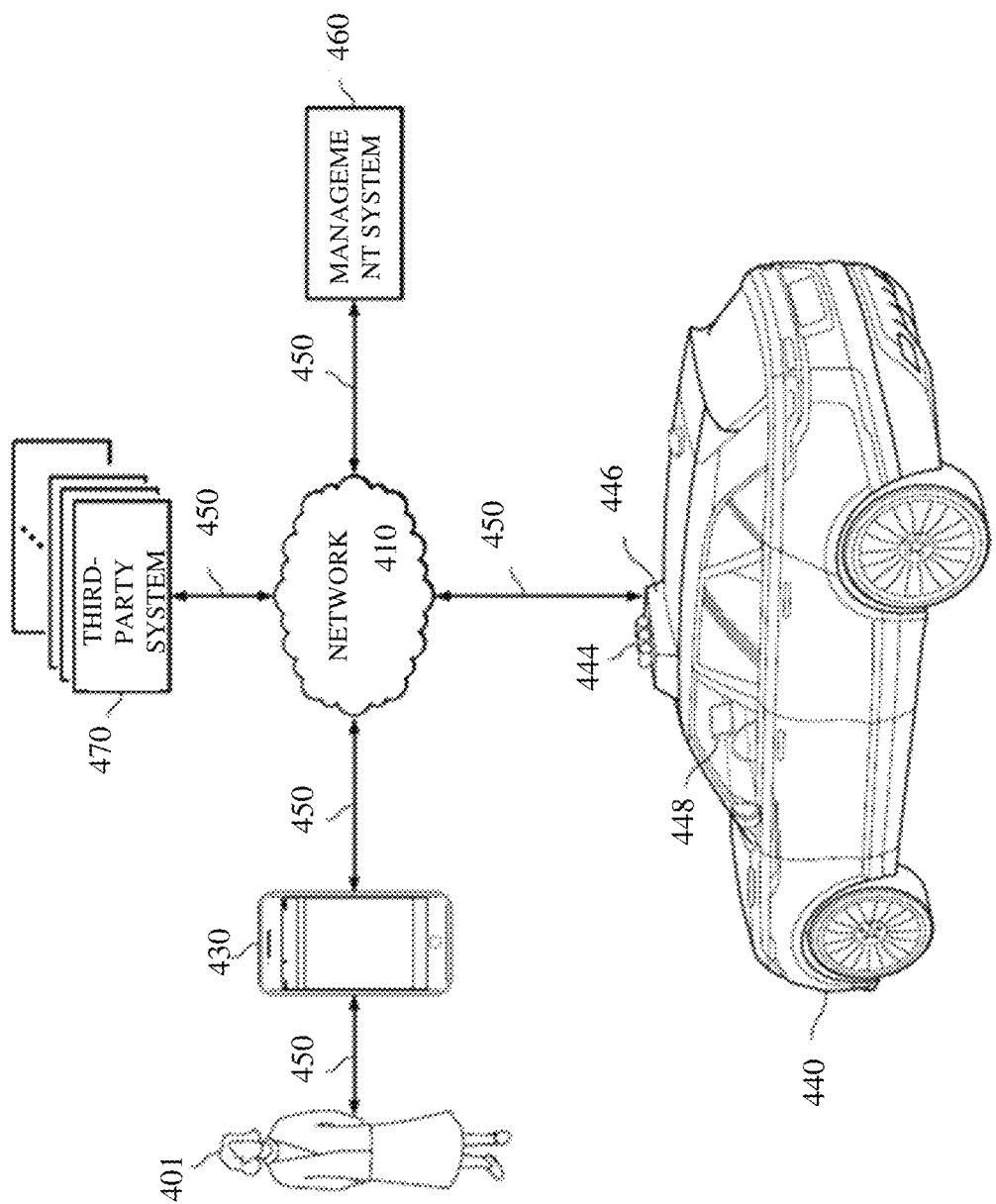
FIG. 4 illustrates an example block diagram of a transportation management environment.

FIG. 4 illustrates an example block diagram of a transportation management environment for matching ride requestors with autonomous vehicles. In particular embodiments, the environment may include various computing entities, such as a user computing device 430 of a user 401 (e.g., a ride provider or requestor), a transportation management system 460, an autonomous vehicle 440, and one or more third-party system 470. The computing entities may be communicatively connected over any suitable network 410. As an example and not by way of limitation, one or more portions of network 410 may include an ad hoc network, an extranet, a virtual private network (VPN), a local area network (LAN), a wireless LAN (WLAN), a wide area network (WAN), a wireless WAN (WWAN), a metropolitan area network (MAN), a portion of the Internet, a portion of Public Switched Telephone Network (PSTN), a cellular network, or a combination of any of the above. In particular embodiments, any suitable network arrangement and protocol enabling the computing entities to communicate with each other may be used. Although FIG. 4 illustrates a single user device 430, a single transportation management system 460, a single vehicle 440, a plurality of third-party systems 470, and a single network 410, this disclosure contemplates any suitable number of each of these entities. As an example and not by way of limitation, the network environment may include multiple users 401, user devices 430, transportation management systems 460, autonomous-vehicles 440, third-party systems 470, and networks 410.

The user device 430, transportation management system 460, autonomous vehicle 440, and third-party system 470 may be communicatively connected or co-located with each other in whole or in part. These computing entities may communicate via different transmission technologies and network types. For example, the user device 430 and the vehicle 440 may communicate with each other via a cable or short-range wireless communication (e.g., Bluetooth, NFC, WI-FI, etc.), and together they may be connected to the Internet via a cellular network that is accessible to either one of the devices (e.g., the user device 430 may be a smartphone with LTE connection). The transportation management system 460 and third-party system 470, on the other hand, may be connected to the Internet via their respective LAN/WLAN networks and Internet Service Providers (ISP). FIG. 4 illustrates transmission links 450 that connect user device 430, autonomous vehicle 440, transportation management system 460, and third-party system 470 to communication network 410. This disclosure contemplates any suitable transmission links 450, including, e.g., wire connections (e.g., USB, Lightning, Digital Subscriber Line (DSL) or Data Over Cable Service Interface Specification (DOCSIS)), wireless connections (e.g., WI-FI, WiMAX, cellular, satellite, NFC, Bluetooth), optical connections (e.g., Synchronous Optical Networking (SONET), Synchronous Digital Hierarchy (SDH)), any other wireless communication technologies, and any combination thereof. In particular embodiments, one or more links 450 may connect to one or more networks 410, which may include in part, e.g., ad-hoc network, the Intranet, extranet, VPN, LAN, WLAN, WAN, WWAN, MAN, PSTN, a cellular network, a satellite network, or any combination thereof. The computing entities need not necessarily use the same type of transmission link 450. For example, the user device 430 may communicate with the transportation management system via a cellular network and the Internet, but communicate with the autonomous vehicle 440 via Bluetooth or a physical wire connection.

In particular embodiments, the transportation management system 460 may fulfill ride requests for one or more users 401 by dispatching suitable vehicles. The transportation management system 460 may receive any number of ride requests from any number of ride requestors 401. In particular embodiments, a ride request from a ride requestor 401 may include an identifier that identifies the ride requestor in the system 460. The transportation management system 460 may use the identifier to access and store the ride requestor's 401 information, in accordance with the requestor's 401 privacy settings. The ride requestor's 401 information may be stored in one or more data stores (e.g., a relational database system) associated with and accessible to the transportation management system 460. In particular embodiments, ride requestor information may include profile information about a particular ride requestor 401. In particular embodiments, the ride requestor 401 may be associated with one or more categories or types, through which the ride requestor 401 may be associated with aggregate information about certain ride requestors of those categories or types. Ride information may include, for example, preferred pick-up and drop-off locations, driving preferences (e.g., safety comfort level, preferred speed, rates of acceleration/deceleration, safety distance from other vehicles when travelling at various speeds, route, etc.), entertainment preferences and settings (e.g., preferred music genre or playlist, audio volume, display brightness, etc.), temperature settings, whether conversation with the driver is welcomed, frequent destinations, historical riding patterns (e.g., time of day of travel, starting and ending locations, etc.), preferred language, age, gender, or any other suitable information. In particular embodiments, the transportation management system 460 may classify a user 401 based on known information about the user 401 (e.g., using machine-learning classifiers), and use the classification to retrieve relevant aggregate information associated with that class. For example, the system 460 may classify a user 401 as a young adult and retrieve relevant aggregate information associated with young adults, such as the type of music generally preferred by young adults.

Transportation management system 460 may also store and access ride information. Ride information may include locations related to the ride, traffic data, route options, optimal pick-up or drop-off locations for the ride, or any other suitable information associated with a ride. As an example and not by way of limitation, when the transportation management system 460 receives a request to travel from San Francisco International Airport (SFO) to Palo Alto, Calif., the system 460 may access or generate any relevant ride information for this particular ride request. The ride information may include, for example, preferred pick-up locations at SFO; alternate pick-up locations in the event that a pick-up location is incompatible with the ride requestor (e.g., the ride requestor may be disabled and cannot access the pick-up location) or the pick-up location is otherwise unavailable due to construction, traffic congestion, changes in pick-up/drop-off rules, or any other reason;

one or more routes to navigate from SFO to Palo Alto; preferred off-ramps for a type of user; or any other suitable information associated with the ride. In particular embodiments, portions of the ride information may be based on historical data associated with historical rides facilitated by the system 460. For example, historical data may include aggregate information generated based on past ride information, which may include any ride information described herein and telemetry data collected by sensors in autonomous vehicles and/or user devices. Historical data may be associated with a particular user (e.g., that particular user's preferences, common routes, etc.), a category/class of users (e.g., based on demographics), and/or all users of the system 460. For example, historical data specific to a single user may include information about past rides that particular user has taken, including the locations at which the user is picked up and dropped off, music the user likes to listen to, traffic information associated with the rides, time of the day the user most often rides, and any other suitable information specific to the user. As another example, historical data associated with a category/class of users may include, e.g., common or popular ride preferences of users in that category/class, such as teenagers preferring pop music, ride requestors who frequently commute to the financial district may prefer to listen to the news, etc. As yet another example, historical data associated with all users may include general usage trends, such as traffic and ride patterns. Using historical data, the system 460 in particular embodiments may predict and provide ride suggestions in response to a ride request. In particular embodiments, the system 460 may use machine-learning, such as neural networks, regression algorithms, instance-based algorithms (e.g., k-Nearest Neighbor), decision-tree algorithms, Bayesian algorithms, clustering algorithms, association-rule-learning algorithms, deep-learning algorithms, dimensionality-reduction algorithms, ensemble algorithms, and any other suitable machine-learning algorithms known to persons of ordinary skill in the art. The machine-learning models may be trained using any suitable training algorithm, including supervised learning based on labeled training data, unsupervised learning based on unlabeled training data, and/or semi-supervised learning based on a mixture of labeled and unlabeled training data.

In particular embodiments, transportation management system 460 may include one or more server computers. Each server may be a unitary server or a distributed server spanning multiple computers or multiple datacenters. The servers may be of various types, such as, for example and without limitation, web server, news server, mail server, message server, advertising server, file server, application server, exchange server, database server, proxy server, another server suitable for performing functions or processes described herein, or any combination thereof. In particular embodiments, each server may include hardware, software, or embedded logic components or a combination of two or more such components for carrying out the appropriate functionalities implemented or supported by the server. In particular embodiments, transportation management system 460 may include one or more data stores. The data stores may be used to store various types of information, such as ride information, ride requestor information, ride provider information, historical information, third-party information, or any other suitable type of information. In particular embodiments, the information stored in the data stores may be organized according to specific data structures. In particular embodiments, each data store may be a relational, columnar, correlation, or any other suitable type of database system. Although this disclosure describes or illustrates particular types of databases, this disclosure contemplates any suitable types of databases. Particular embodiments may provide interfaces that enable a user device 430 (which may belong to a ride requestor or provider), a transportation management system 460, vehicle system 440, or a third-party system 470 to process, transform, manage, retrieve, modify, add, or delete the information stored in the data store.

In particular embodiments, transportation management system 460 may include an authorization server (or any other suitable component(s)) that allows users 401 to opt-in to or opt-out of having their information and actions logged, recorded, or sensed by transportation management system 460 or shared with other systems (e.g., third-party systems 470). In particular embodiments, a user 401 may opt-in or opt-out by setting appropriate privacy settings. A privacy setting of a user may determine what information associated with the user may be logged, how information associated with the user may be logged, when information associated with the user may be logged, who may log information associated with the user, whom information associated with the user may be shared with, and for what purposes information associated with the user may be logged or shared. Authorization servers may be used to enforce one or more privacy settings of the users 401 of transportation management system 460 through blocking, data hashing, anonymization, or other suitable techniques as appropriate.

In particular embodiments, third-party system 470 may be a network-addressable computing system that may provide HD maps or host GPS maps, customer reviews, music or content, weather information, or any other suitable type of information. Third-party system 470 may generate, store, receive, and send relevant data, such as, for example, map data, customer review data from a customer review website, weather data, or any other suitable type of data. Third-party system 470 may be accessed by the other computing entities of the network environment either directly or via network 410. For example, user device 430 may access the third-party system 470 via network 410, or via transportation management system 460. In the latter case, if credentials are required to access the third-party system 470, the user 401 may provide such information to the transportation management system 460, which may serve as a proxy for accessing content from the third-party system 470.

In particular embodiments, user device 430 may be a mobile computing device such as a smartphone, tablet computer, or laptop computer. User device 430 may include one or more processors (e.g., CPU and/or GPU), memory, and storage. An operating system and applications may be installed on the user device 430, such as, e.g., a transportation application associated with the transportation management system 460, applications associated with third-party systems 470, and applications associated with the operating system. User device 430 may include functionality for determining its location, direction, or orientation, based on integrated sensors such as GPS, compass, gyroscope, or accelerometer. User device 430 may also include wireless transceivers for wireless communication and may support wireless communication protocols such as Bluetooth, near-field communication (NFC), infrared (IR) communication, WI-FI, and/or 2G/3G/4G/LTE mobile communication standard. User device 430 may also include one or more cameras, scanners, touchscreens, microphones, speakers, and any other suitable input-output devices.

In particular embodiments, the vehicle 440 may be an autonomous vehicle and equipped with an array of sensors 444, a navigation system 446, and a ride-service computing device 448. In particular embodiments, a fleet of autonomous vehicles 440 may be managed by the transportation management system 460. The fleet of autonomous vehicles 440, in whole or in part, may be owned by the entity associated with the transportation management system 460, or they may be owned by a third-party entity relative to the transportation management system 460. In either case, the transportation management system 460 may control the operations of the autonomous vehicles 440, including, e.g., dispatching select vehicles 440 to fulfill ride requests, instructing the vehicles 440 to perform select operations (e.g., head to a service center or charging/fueling station, pull over, stop immediately, self-diagnose, lock/unlock compartments, change music station, change temperature, and any other suitable operations), and instructing the vehicles 440 to enter select operation modes (e.g., operate normally, drive at a reduced speed, drive under the command of human operators, and any other suitable operational modes).

In particular embodiments, the autonomous vehicles 440 may receive data from and transmit data to the transportation management system 460 and the third-party system 470. Example of received data may include, e.g., instructions, new software or software updates, maps, 3D models, trained or untrained machine-learning models, location information (e.g., location of the ride requestor, the autonomous vehicle 440 itself, other autonomous vehicles 440, and target destinations such as service centers), navigation information, traffic information, weather information, entertainment content (e.g., music, video, and news) ride requestor information, ride information, and any other suitable information. Examples of data transmitted from the autonomous vehicle 440 may include, e.g., telemetry and sensor data, determinations/decisions based on such data, vehicle condition or state (e.g., battery/fuel level, tire and brake conditions, sensor condition, speed, odometer, etc.), location, navigation data, passenger inputs (e.g., through a user interface in the vehicle 440, passengers may send/receive data to the transportation management system 460 and/or third-party system 470), and any other suitable data.

In particular embodiments, autonomous vehicles 440 may also communicate with each other as well as other traditional human-driven vehicles, including those managed and not managed by the transportation management system 460. For example, one vehicle 440 may communicate with another vehicle data regarding their respective location, condition, status, sensor reading, and any other suitable information. In particular embodiments, vehicle-to-vehicle communication may take place over direct short-range wireless connection (e.g., WI-FI, Bluetooth, NFC) and/or over a network (e.g., the Internet or via the transportation management system 460 or third-party system 470).

In particular embodiments, an autonomous vehicle 440 may obtain and process sensor/telemetry data. Such data may be captured by any suitable sensors. For example, the vehicle 440 may have a LiDAR sensor array of multiple LiDAR transceivers that are configured to rotate 360°, emitting pulsed laser light and measuring the reflected light from objects surrounding vehicle 440. In particular embodiments, LiDAR transmitting signals may be steered by use of a gated light valve, which may be a MEMs device that directs a light beam using the principle of light diffraction. Such a device may not use a gimbaled mirror to steer light beams in 360° around the autonomous vehicle. Rather, the gated light valve may direct the light beam into one of several optical fibers, which may be arranged such that the light beam may be directed to many discrete positions around the autonomous vehicle. Thus, data may be captured in 360° around the autonomous vehicle, but no rotating parts may be necessary. A LiDAR is an effective sensor for measuring distances to targets, and as such may be used to generate a three-dimensional (3D) model of the external environment of the autonomous vehicle 440. As an example and not by way of limitation, the 3D model may represent the external environment including objects such as other cars, curbs, debris, objects, and pedestrians up to a maximum range of the sensor arrangement (e.g., 50, 100, or 200 meters). As another example, the autonomous vehicle 440 may have optical cameras pointing in different directions. The cameras may be used for, e.g., recognizing roads, lane markings, street signs, traffic lights, police, other vehicles, and any other visible objects of interest. To enable the vehicle 440 to "see" at night, infrared cameras may be installed. In particular embodiments, the vehicle may be equipped with stereo vision for, e.g., spotting hazards such as pedestrians or tree branches on the road. As another example, the vehicle 440 may have radars for, e.g., detecting other vehicles and/or hazards afar. Furthermore, the vehicle 440 may have ultrasound equipment for, e.g., parking and obstacle detection. In addition to sensors enabling the vehicle 440 to detect, measure, and understand the external world around it, the vehicle 440 may further be equipped with sensors for detecting and self-diagnosing the vehicle's own state and condition. For example, the vehicle 440 may have wheel sensors for, e.g., measuring velocity; global positioning system (GPS) for, e.g., determining the vehicle's current geolocation; and/or inertial measurement units, accelerometers, gyroscopes, and/or odometer systems for movement or motion detection. While the description of these sensors provides particular examples of utility, one of ordinary skill in the art would appreciate that the utilities of the sensors are not limited to those examples. Further, while an example of a utility may be described with respect to a particular type of sensor, it should be appreciated that the utility may be achieved using any combination of sensors. For example, an autonomous vehicle 440 may build a 3D model of its surrounding based on data from its LiDAR, radar, sonar, and cameras, along with a pre-generated map obtained from the transportation management system 460 or the third-party system 470. Although sensors 444 appear in a particular location on autonomous vehicle 440 in FIG. 4, sensors 444 may be located in any suitable location in or on autonomous vehicle 440. Example locations for sensors include the front and rear bumpers, the doors, the front windshield, on the side panel, or any other suitable location.

In particular embodiments, the autonomous vehicle 440 may be equipped with a processing unit (e.g., one or more CPUs and GPUs), memory, and storage. The vehicle 440 may thus be equipped to perform a variety of computational and processing tasks, including processing the sensor data, extracting useful information, and operating accordingly. For example, based on images captured by its cameras and a machine-vision model, the vehicle 440 may identify particular types of objects captured by the images, such as pedestrians, other vehicles, lanes, curbs, and any other objects of interest.

In particular embodiments, the autonomous vehicle 440 may have a navigation system 446 responsible for safely navigating the autonomous vehicle 440. In particular embodiments, the navigation system 446 may take as input any type of sensor data from, e.g., a Global Positioning System (GPS) module, inertial measurement unit (IMU), LiDAR sensors, optical cameras, radio frequency (RF) transceivers, or any other suitable telemetry or sensory mechanisms. The navigation system 446 may also utilize, e.g., map data, traffic data, accident reports, weather reports, instructions, target destinations, and any other suitable information to determine navigation routes and particular driving operations (e.g., slowing down, speeding up, stopping, swerving, etc.). In particular embodiments, the navigation system 446 may use its determinations to control the vehicle 440 to operate in prescribed manners and to guide the autonomous vehicle 440 to its destinations without colliding into other objects. Although the physical embodiment of the navigation system 446 (e.g., the processing unit) appears in a particular location on autonomous vehicle 440 in FIG. 4, navigation system 446 may be located in any suitable location in or on autonomous vehicle 440. Example locations for navigation system 446 include inside the cabin or passenger compartment of autonomous vehicle 440, near the engine/battery, near the front seats, rear seats, or in any other suitable location.

In particular embodiments, the autonomous vehicle 440 may be equipped with a ride-service computing device 448, which may be a tablet or any other suitable device installed by transportation management system 460 to allow the user to interact with the autonomous vehicle 440, transportation management system 460, other users 401, or third-party systems 470. In particular embodiments, installation of ride-service computing device 448 may be accomplished by placing the ride-service computing device 448 inside autonomous vehicle 440, and configuring it to communicate with the vehicle 440 via a wire or wireless connection (e.g., via Bluetooth). Although FIG. 4 illustrates a single ride-service computing device 448 at a particular location in autonomous vehicle 440, autonomous vehicle 440 may include several ride-service computing devices 448 in several different locations within the vehicle. As an example and not by way of limitation, autonomous vehicle 440 may include four ride-service computing devices 448 located in the following places: one in front of the front-left passenger seat (e.g., driver's seat in traditional U.S. automobiles), one in front of the front-right passenger seat, one in front of each of the rear-left and rear-right passenger seats. In particular embodiments, ride-service computing device 448 may be detachable from any component of autonomous vehicle 440. This may allow users to handle ride-service computing device 448 in a manner consistent with other tablet computing devices. As an example and not by way of limitation, a user may move ride-service computing device 448 to any location in the cabin or passenger compartment of autonomous vehicle 440, may hold ride-service computing device 448, or handle ride-service computing device 448 in any other suitable manner. Although this disclosure describes providing a particular computing device in a particular manner, this disclosure contemplates providing any suitable computing device in any suitable manner.

Figure 5:
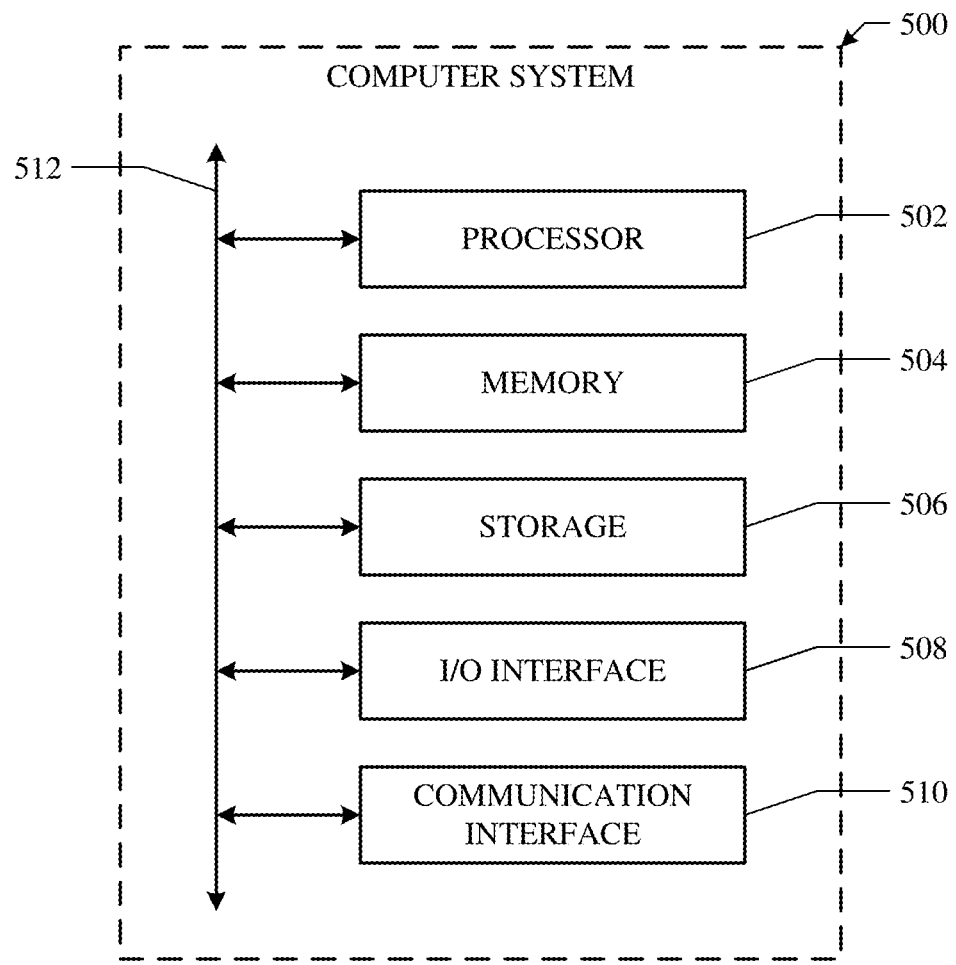
FIG. 5 illustrates an example of a computing system.

FIG. 5 illustrates an example computer system 500. In particular embodiments, one or more computer systems 500 perform one or more steps of one or more methods described or illustrated herein. In particular embodiments, one or more computer systems 500 provide the functionalities described or illustrated herein. In particular embodiments, software running on one or more computer systems 500 performs one or more steps of one or more methods described or illustrated herein or provides the functionalities described or illustrated herein. Particular embodiments include one or more portions of one or more computer systems 500. Herein, a reference to a computer system may encompass a computing device, and vice versa, where appropriate. Moreover, a reference to a computer system may encompass one or more computer systems, where appropriate.

This disclosure contemplates any suitable number of computer systems 500. This disclosure contemplates computer system 500 taking any suitable physical form. As example and not by way of limitation, computer system 500 may be an embedded computer system, a system-on-chip (SOC), a single-board computer system (SBC) (such as, for example, a computer-on-module (COM) or system-on-module (SOM)), a desktop computer system, a laptop or notebook computer system, an interactive kiosk, a mainframe, a mesh of computer systems, a mobile telephone, a personal digital assistant (PDA), a server, a tablet computer system, an augmented/virtual reality device, or a combination of two or more of these. Where appropriate, computer system 500 may include one or more computer systems 500; be unitary or distributed; span multiple locations; span multiple machines; span multiple data centers; or reside in a cloud, which may include one or more cloud components in one or more networks. Where appropriate, one or more computer systems 500 may perform without substantial spatial or temporal limitation one or more steps of one or more methods described or illustrated herein. As an example and not by way of limitation, one or more computer systems 500 may perform in real time or in batch mode one or more steps of one or more methods described or illustrated herein. One or more computer systems 500 may perform at different times or at different locations one or more steps of one or more methods described or illustrated herein, where appropriate.

In particular embodiments, computer system 500 includes a processor 502, memory 504, storage 506, an input/output (I/O) interface 508, a communication interface 510, and a bus 512. Although this disclosure describes and illustrates a particular computer system having a particular number of particular components in a particular arrangement, this disclosure contemplates any suitable computer system having any suitable number of any suitable components in any suitable arrangement.

In particular embodiments, processor 502 includes hardware for executing instructions, such as those making up a computer program. As an example and not by way of limitation, to execute instructions, processor 502 may retrieve (or fetch) the instructions from an internal register, an internal cache, memory 504, or storage 506; decode and execute them; and then write one or more results to an internal register, an internal cache, memory 504, or storage 506. In particular embodiments, processor 502 may include one or more internal caches for data, instructions, or addresses. This disclosure contemplates processor 502 including any suitable number of any suitable internal caches, where appropriate. As an example and not by way of limitation, processor 502 may include one or more instruction caches, one or more data caches, and one or more translation lookaside buffers (TLBs). Instructions in the instruction caches may be copies of instructions in memory 504 or storage 506, and the instruction caches may speed up retrieval of those instructions by processor 502. Data in the data caches may be copies of data in memory 504 or storage 506 that are to be operated on by computer instructions; the results of previous instructions executed by processor 502 that are accessible to subsequent instructions or for writing to memory 504 or storage 506; or any other suitable data. The data caches may speed up read or write operations by processor 502. The TLBs may speed up virtual-address translation for processor 502. In particular embodiments, processor 502 may include one or more internal registers for data, instructions, or addresses. This disclosure contemplates processor 502 including any suitable number of any suitable internal registers, where appropriate. Where appropriate, processor 502 may include one or more arithmetic logic units (ALUs), be a multi-core processor, or include one or more processors 502. Although this disclosure describes and illustrates a particular processor, this disclosure contemplates any suitable processor.

In particular embodiments, memory 504 includes main memory for storing instructions for processor 502 to execute or data for processor 502 to operate on. As an example and not by way of limitation, computer system 500 may load instructions from storage 506 or another source (such as another computer system 500) to memory 504. Processor 502 may then load the instructions from memory 504 to an internal register or internal cache. To execute the instructions, processor 502 may retrieve the instructions from the internal register or internal cache and decode them. During or after execution of the instructions, processor 502 may write one or more results (which may be intermediate or final results) to the internal register or internal cache. Processor 502 may then write one or more of those results to memory 504. In particular embodiments, processor 502 executes only instructions in one or more internal registers or internal caches or in memory 504 (as opposed to storage 506 or elsewhere) and operates only on data in one or more internal registers or internal caches or in memory 504 (as opposed to storage 506 or elsewhere). One or more memory buses (which may each include an address bus and a data bus) may couple processor 502 to memory 504. Bus 512 may include one or more memory buses, as described in further detail below. In particular embodiments, one or more memory management units (MMUs) reside between processor 502 and memory 504 and facilitate accesses to memory 504 requested by processor 502. In particular embodiments, memory 504 includes random access memory (RAM). This RAM may be volatile memory, where appropriate. Where appropriate, this RAM may be dynamic RAM (DRAM) or static RAM (SRAM). Moreover, where appropriate, this RAM may be single-ported or multi-ported RAM. This disclosure contemplates any suitable RAM. Memory 504 may include one or more memories 504, where appropriate. Although this disclosure describes and illustrates particular memory, this disclosure contemplates any suitable memory.

In particular embodiments, storage 506 includes mass storage for data or instructions. As an example and not by way of limitation, storage 506 may include a hard disk drive (HDD), a floppy disk drive, flash memory, an optical disc, a magneto-optical disc, magnetic tape, or a Universal Serial Bus (USB) drive or a combination of two or more of these. Storage 506 may include removable or non-removable (or fixed) media, where appropriate. Storage 506 may be internal or external to computer system 500, where appropriate. In particular embodiments, storage 506 is non-volatile, solid-state memory. In particular embodiments, storage 506 includes read-only memory (ROM). Where appropriate, this ROM may be mask-programmed ROM, programmable ROM (PROM), erasable PROM (EPROM), electrically erasable PROM (EEPROM), electrically alterable ROM (EAROM), or flash memory or a combination of two or more of these. This disclosure contemplates mass storage 506 taking any suitable physical form. Storage 506 may include one or more storage control units facilitating communication between processor 502 and storage 506, where appropriate. Where appropriate, storage 506 may include one or more storages 506. Although this disclosure describes and illustrates particular storage, this disclosure contemplates any suitable storage.

In particular embodiments, I/O interface 508 includes hardware, software, or both, providing one or more interfaces for communication between computer system 500 and one or more I/O devices. Computer system 500 may include one or more of these I/O devices, where appropriate. One or more of these I/O devices may enable communication between a person and computer system 500. As an example and not by way of limitation, an I/O device may include a keyboard, keypad, microphone, monitor, mouse, printer, scanner, speaker, still camera, stylus, tablet, touch screen, trackball, video camera, another suitable I/O device or a combination of two or more of these. An I/O device may include one or more sensors. This disclosure contemplates any suitable I/O devices and any suitable I/O interfaces 508 for them. Where appropriate, I/O interface 508 may include one or more device or software drivers enabling processor 502 to drive one or more of these I/O devices. I/O interface 508 may include one or more I/O interfaces 508, where appropriate. Although this disclosure describes and illustrates a particular I/O interface, this disclosure contemplates any suitable I/O interface.

In particular embodiments, communication interface 510 includes hardware, software, or both providing one or more interfaces for communication (such as, for example, packet-based communication) between computer system 500 and one or more other computer systems 500 or one or more networks. As an example and not by way of limitation, communication interface 510 may include a network interface controller (NIC) or network adapter for communicating with an Ethernet or any other wire-based network or a wireless NIC (WNIC) or wireless adapter for communicating with a wireless network, such as a WI-FI network. This disclosure contemplates any suitable network and any suitable communication interface 510 for it. As an example and not by way of limitation, computer system 500 may communicate with an ad hoc network, a personal area network (PAN), a local area network (LAN), a wide area network (WAN), a metropolitan area network (MAN), or one or more portions of the Internet or a combination of two or more of these. One or more portions of one or more of these networks may be wired or wireless. As an example, computer system 500 may communicate with a wireless PAN (WPAN) (such as, for example, a Bluetooth WPAN), a WI-FI network, a WI-MAX network, a cellular telephone network (such as, for example, a Global System for Mobile Communications (GSM) network), or any other suitable wireless network or a combination of two or more of these. Computer system 500 may include any suitable communication interface 510 for any of these networks, where appropriate. Communication interface 510 may include one or more communication interfaces 510, where appropriate. Although this disclosure describes and illustrates a particular communication interface, this disclosure contemplates any suitable communication interface.

In particular embodiments, bus 512 includes hardware, software, or both coupling components of computer system 500 to each other. As an example and not by way of limitation, bus 512 may include an Accelerated Graphics Port (AGP) or any other graphics bus, an Enhanced Industry Standard Architecture (EISA) bus, a front-side bus (FSB), a HYPERTRANSPORT (HT) interconnect, an Industry Standard Architecture (ISA) bus, an INFINIBAND interconnect, a low-pin-count (LPC) bus, a memory bus, a Micro Channel Architecture (MCA) bus, a Peripheral Component Interconnect (PCI) bus, a PCI-Express (PCIe) bus, a serial advanced technology attachment (SATA) bus, a Video Electronics Standards Association local (VLB) bus, or another suitable bus or a combination of two or more of these. Bus 512 may include one or more buses 512, where appropriate. Although this disclosure describes and illustrates a particular bus, this disclosure contemplates any suitable bus or interconnect.

Herein, a computer-readable non-transitory storage medium or media may include one or more semiconductor-based or other types of integrated circuits (ICs) (such, as for example, field-programmable gate arrays (FPGAs) or application-specific ICs (ASICs)), hard disk drives (HDDs), hybrid hard drives (HHDs), optical discs, optical disc drives (ODDs), magneto-optical discs, magneto-optical drives, floppy diskettes, floppy disk drives (FDDs), magnetic tapes, solid-state drives (SSDs), RAM-drives, SECURE DIGITAL cards or drives, any other suitable computer-readable non-transitory storage media, or any suitable combination of two or more of these, where appropriate. A computer-readable non-transitory storage medium may be volatile, non-volatile, or a combination of volatile and non-volatile, where appropriate.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, feature, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative. Additionally, although this disclosure describes or illustrates particular embodiments as providing particular advantages, particular embodiments may provide none, some, or all of these advantages.

What is claimed is:

1. An apparatus comprising:
   a volatile memory module configured to store vehicle data;
   a collision-detector module configured to identify a collision event of a vehicle has occurred;
   a refrigeration module coupled to the volatile memory module, wherein the refrigeration module is configured to lower a temperature of the volatile memory module in response to receiving a signal initiating lowering the temperature of the volatile memory module and in response to receiving energy from an energy-storage module; and
   a controller coupled to the collision-detector module, the refrigeration module, and the energy-storage module, wherein in response to receiving an indication from the collision-detector module that the collision event has occurred, the controller is configured to:
   initiate lowering the temperature of the volatile memory module by the refrigeration module; and
   initiate a transfer of energy stored in the energy-storage module to the refrigeration module.

2. The apparatus of claim 1, further comprising a heat sink, heat pipe, or heat spreader in contact with the volatile memory module.

3. The apparatus of claim 1, wherein the refrigeration module comprises a barrier separating a chamber containing a first material and a chamber containing a second material, wherein:
   the barrier separating the chamber containing the first material and the chamber containing the second material is removed in response to receiving the signal initiating lowering the temperature of the volatile memory module; and
   the first and second materials have a reaction causing lowering of the temperature of the volatile memory module once the first and second materials are mixed.

4. The apparatus of claim 3, wherein the first material and the second material comprise water and ammonium salt, water and ammonium chloride, water and ammonium nitrate, water and potassium chloride, barium hydroxide octahydrate crystals and dry ammonium chloride, or thionyl chloride (SOC12) and cobalt(II) sulfate heptahydrate.

5. The apparatus of claim 1, wherein the refrigeration module is a thermoelectric refrigerator.

6. The apparatus of claim 1, wherein the volatile memory module, the refrigeration module, the collision-detector module, and the controller are housed in a black box enclosure.

7. The apparatus of claim 1, wherein the volatile memory module is configured to receive sensor data and vehicle information from one or more processing units.

8. The apparatus of claim 1, wherein the vehicle data comprises video or images from infrared cameras or optical cameras, light detection and ranging (LiDAR) imaging data, radar data, global positioning system (GPS) data, inertial measurement unit data, or accelerometer data.

9. The apparatus of claim 1, wherein the vehicle data comprises computational logs, intermediate computation results, object detection results, speed information, or sensor status information.

10. The apparatus of claim 1, wherein the vehicle data comprises image data from one or more optical cameras or imaging data from one or more LiDAR receivers.

11. The apparatus of claim 1, further comprising the energy-storage module and a non-volatile memory module, wherein the energy-storage module is configured to store power for writing the vehicle data stored in the volatile memory module on the non-volatile memory module.

12. The apparatus of claim 1, further comprising a non-volatile memory module, wherein the vehicle data is written on the non-volatile memory module only when the collision event has occurred.

13. The apparatus of claim 1, wherein a storage capacity of the volatile memory module is sufficient to store at least 30 seconds of imaging and LiDAR data gathered by one or more sensors of the vehicle.

14. The apparatus of claim 1, wherein the vehicle data stored in the volatile memory module comprises sensor data or navigation decision data.

15. A method comprising, by a computing device:
receiving an indication from a collision-detector module that a collision event of a vehicle has occurred;
initiating a transfer of energy stored in an energy-storage module to a refrigeration module in response to receiving the indication from the collision-detector module that the collision event has occurred; and
transmitting a signal to the refrigeration module initiating lowering a temperature of a volatile memory module in response to receiving the indication from the collision-detector module that the collision event has occurred, wherein the refrigeration module is configured to lower the temperature of the volatile memory module in response to receiving energy from the energy-storage module.

16. The method of claim 15, further comprising transmitting a signal to a bus controller initiating a transfer of vehicle data stored in the volatile memory module to a non-volatile memory module in response to receiving the indication from the collision-detector module that the collision event has occurred.

17. The method claim 15, wherein the signal transmitted to the refrigeration module initiates a mixing of water with an ammonium salt for lowering the temperature of the volatile memory module.

18. One or more computer-readable non-transitory storage media embodying software that is operable when executed to cause one or more processors to perform operations comprising:
receive an indication from a collision-detector module that a collision event of a vehicle has occurred;
initiate a transfer of energy stored in an energy-storage module to a refrigeration module in response to receiving the indication from the collision-detector module that the collision event has occurred; and
transmit a signal to the refrigeration module initiating lowering a temperature of a volatile memory module in response to receiving the indication from the collision-detector module that the collision event has occurred, wherein the refrigeration module is configured to lower the temperature of the volatile memory module in response to receiving energy from the energy-storage module.

19. The media of claim 18, wherein the software is further operable to transmit a signal to a bus controller initiating a transfer of vehicle data stored in the volatile memory module to a non-volatile memory module in response to receiving the indication from the collision-detector module that the collision event has occurred.

20. The media of claim 18, wherein the signal transmitted to the refrigeration module initiates a mixing of water with an ammonium salt for lowering the temperature of the volatile memory module.

* * * * *